United States Patent
Aravindhan

(10) Patent No.: US 9,047,257 B2
(45) Date of Patent: Jun. 2, 2015

(54) CONCURRENT HOST OPERATION AND DEVICE DEBUG OPERATION WITH SINGLE PORT EXTENSIBLE HOST INTERFACE (XHCI) HOST CONTROLLER

(71) Applicant: Synopsys, Inc., Mountain View, CA (US)

(72) Inventor: Subramaniam Aravindhan, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 62 days.

(21) Appl. No.: 13/650,096

(22) Filed: Oct. 11, 2012

(65) Prior Publication Data

US 2014/0108870 A1     Apr. 17, 2014

(51) Int. Cl.
*G06F 11/00*     (2006.01)
*G06F 11/22*     (2006.01)
*H01R 31/00*     (2006.01)
*G01R 31/317*     (2006.01)

(52) U.S. Cl.
CPC ......... *G06F 11/221* (2013.01); *Y10T 29/49174* (2015.01); *H01R 31/005* (2013.01); *G01R 31/31705* (2013.01)

(58) Field of Classification Search
CPC .............................. H01R 27/00; G06F 11/3656
USPC ........................................................... 714/43
See application file for complete search history.

(56) References Cited

U.S. PATENT DOCUMENTS

| | | | |
|---|---|---|---|
| 2004/0024920 A1 | 2/2004 | Gulick et al. | |
| 2005/0182883 A1 | 8/2005 | Overtoom | |
| 2006/0073717 A1 | 4/2006 | Ng et al. | |
| 2007/0006035 A1* | 1/2007 | Usui | 714/38 |
| 2007/0028011 A1 | 2/2007 | Lee et al. | |
| 2007/0180334 A1* | 8/2007 | Jones et al. | 714/45 |
| 2011/0093640 A1 | 4/2011 | Hui et al. | |
| 2011/0107310 A1 | 5/2011 | Pont et al. | |
| 2011/0188193 A1* | 8/2011 | Yi | 361/679.32 |
| 2011/0208891 A1* | 8/2011 | Meyers | 710/313 |
| 2011/0307741 A1* | 12/2011 | Chen et al. | 714/38.1 |

OTHER PUBLICATIONS

International Search Report and Written Opinion for co-pending PCT Application No. PCT/US2013/060222 filed Sep. 17, 2013 (12 pages).

* cited by examiner

*Primary Examiner* — Sarai Butler
(74) *Attorney, Agent, or Firm* — Bever, Hoffman & Harms, LLP

(57) ABSTRACT

An improved USB host controller and method supports concurrent host and device debug operations with only one usable USB port. The described embodiments save silicon cost and avoid additional connectors, which are undesirable in ever-smaller devices.

24 Claims, 11 Drawing Sheets

|   | CON 1 | CON 2 | CON 3 | CABLE 1 | CABLE 2 | USB Device | Debug Host |
|---|---|---|---|---|---|---|---|
| 1 | USB 3.0 A or AB | USB 2.0 B or AB | USB 3.0 A or AB | USB 2.0 (VBUS, D-, D+, GND) | SuperSpeed (GND, StdA_SSRX-, StdA_SSRX+, GND_DRAIN, StdA_SSTX-, and StdA_SSTX+). | USB 2.0 or USB 3.0 | USB 3.0 |
| 2 | USB 3.0 A or AB | USB 3.0 B or AB | USB 3.0 A or AB | USB 2.0 (VBUS, D-, D+, GND) | SuperSpeed (GND, StdA_SSRX-, StdA_SSRX+, GND_DRAIN, StdA_SSTX-, and StdA_SSTX+ | USB 3.0 | USB 3.0 |
| 3 | USB 3.0 A or AB | USB 3.0 B or AB | USB 2.0 A or AB | SuperSpeed (VBUS, GND, StdA_SSRX-, StdA_SSRX+, GND_DRAIN, StdA_SSTX-, and StdA_SSTX+) | USB 2.0 (D-, D+, GND) | USB 3.0 | USB 2.0 or USB 3.0 |
| 4 | USB 3.0 A or AB | USB 3.0 B or AB | USB 3.0 A or AB | SuperSpeed (VBUS, GND, StdA_SSRX-, StdA_SSRX+, GND_DRAIN, StdA_SSTX-, and StdA_SSTX | USB 2.0 (D-, D+, GND) | USB 3.0 | USB 3.0 |

CONCURRENT HOST OPERATION AND DEVICE DEBUG OPERATION WITH SINGLE PORT EXTENSIBLE HOST INTERFACE (XHCI) HOST CONTROLLER

BACKGROUND OF THE DISCLOSURE

Related Art

The Universal Serial Bus (USB) set of standards defines the cables, connectors, and communication protocols used for connecting computers and other electronic devices. USB 2.0 provides for a HIGH Speed (HS) transfer of 480 Mbit/s, a FULL Speed of 12 Mbit/s, and a LOW Speed (LS) of 1.5 Mbit/s. USB 3.0 improves both transfer speed and bandwidth compared to USB 2.0. For example, USB 3.0 provides a SuperSpeed (SS) transfer of 5 Gbit/s, thereby making USB 3.0 approximately 10× faster than USB 2.0. Moreover, USB 3.0 uses two unidirectional data paths (one data path to receive and another data path to transmit) compared to the one-way communication offered by USB 2.0. In USB 3.0, one of HIGH, FULL, and LOW speed operation and SuperSpeed operation can take place simultaneously. Thus, USB 3.0 has backward compatibility with USB 2.0.

As used in the USB industry, the term "connectors" can refer to both plugs and receptacles. USB cables have plugs, whereas hosts or devices have receptacles. According to current USB standards, there are two sizes of connectors, standard and micro (also called mini), and three types (i.e. configurations) of connectors, A, B, and AB. Note that the type AB is provided only for micro receptacles. Hosts (defined in the USB Specification as the host computer system where the USB host controller is installed) have A or AB type receptacles, whereas devices (defined in the USB Specification as logical or physical entities that perform one or more functions) have B (or AB) type receptacles. A type plugs mate with A or AB type receptacles; similarly, B type plugs mate with B or AB type receptacles (for simplicity herein referred to as A plugs, A receptacles, B plugs, B receptacles, and AB receptacles).

Standard A plugs and receptacles from USB 2.0 and 3.0 are designed for interoperability. For example, a USB 3.0 standard A receptacle can accept either a USB 3.0 standard-A plug or a USB 2.0 standard-A plug. Similarly, the USB 3.0 standard-A plug can be plugged into a USB 2.0 standard A receptacle. However, standard-B plugs and receptacles for USB 3.0 are slightly larger than those for USB 2.0. Therefore, for example, USB 2.0 standard-B plugs can be plugged into USB 3.0 standard-B receptacles, but USB 3.0 standard-B plugs cannot be plugged into USB 2.0 standard-B receptacles. The USB 3.0 micro-B plug is compatible with the USB 2.0 micro-B receptacle. The USB 3.0 micro-AB receptacle accepts a USB 3.0 micro-A plug, a USB 3.0 micro-B plug, a USB 2.0 micro-A plug, or a USB 2.0 micro-B plug.

USB 2.0 requires VBUS, D−, D+, and GND pins to be provided in its connectors. FIGS. 1A and 1B illustrate USB 2.0 standard-A and standard-B plugs, respectively. As noted, VBUS, D−, D+, and GND are provided on pins 1, 2, 3, and 4, respectively. The USB 3.0 standard-A and standard-B connectors have the same four pins as the USB 2.0 A and B connectors, but have five more pins as shown in Table I below.

TABLE I

| Pin | Color | Signal Name A connector | Signal Name B connector |
|---|---|---|---|
| 1 | Red | VBUS | |
| 2 | White | D− | |
| 3 | Green | D+ | |
| 4 | Black | GND | |
| 5 | Blue | StdA_SSRX− | StdA_SSTX− |
| 6 | Yellow | StdA_SSRX+ | StdA_SSTX+ |
| 7 | Shield | GND_DRAIN | |
| 8 | Purple | StdA_SSTX− | StdA_SSRX− |
| 9 | Orange | StdA_SSTX+− | StdA_SSRX+ |

In other words, USB 3.0 additionally provides two differential pairs (SuperSpeed transmit (pins 5, 6) and receive (pins 8, 9)) and a ground_drain (pin 7) for signal return. FIGS. 2A and 2B illustrate USB 3.0 standard-A and standard-B plugs, respectively, with pin designations. Note that receptacles mirror the plug pin configurations and therefore are not shown for simplicity.

FIG. 3 illustrates a USB 2.0 micro-A plug 301, a USB 2.0 micro-B plug 302, and a USB 2.0 micro-AB receptacle 303. FIG. 4 illustrates a USB 3.0 micro-A plug 401, a USB 3.0 micro-B plug 402, and a USB 3.0 micro-AB receptacle 403.

The extensible Host Controller Interface (xHCI™) (wherein xHCI™ a trademark of Intel Corporation) is a computer interface Specification that defines a host controller capable of interfacing with USB 1.0, 2.0, and 3.0 (and future) devices. The goal of the xHCI Specification is to minimize power consumption. To that end, the xHCI Specification eliminates host memory activity when there is no USB data movement as well as periodic device polling by allowing the device to notify the host when it has data available to read.

An xHCI host controller can operate in either a host mode or a debug mode. FIG. 5A illustrates an exemplary one-port USB 3.0 xHCI host controller 500. Host controller 500 includes a host 501, a debug device 505, and a data path (buffer and flow control) 502, which is shared by host 501 and debug device 505. In the host mode of host interface controller 500, host 501 is active and can communicate with a USB 2.0 or 3.0 device 504 via a USB 3.0 A-E cable 503. Note that cable 503 needs two plugs: a USB 3.0 A plug to connect to host controller 500 and a USB 3.0 B plug to connect to device 504.

In the debug mode of host controller 500, which is illustrated in FIG. 5B, debug device 505 is active (instead of host 501) and communicates with another host, e.g. USB 3.0 host 508 via a USB 3.0 A-A cable 507 (wherein cable 507 has two USB 3.0 A plugs and does not have VBUS connection). Note that in the debug mode, the host port can negotiate as a device port. In this configuration, the debug port is called the "Debug Target" and the host it is connected to is called the "Debug Host". In FIG. 5B, host 508 is the Debug Host and debug device 505 is the Debug Target. Thus, in this configuration, host 508 can perform debug operations on debug device 505.

An embedded SoC (e.g. a Netbook) or a mobile device (e.g. a cellphone) normally supports only one USB 3.0 port host function. When an xHCI host controller has only one USB 3.0 port, it can be used only as a normal host port (FIG. 5A) or a debug device port (FIG. 5B) at a given time. Concurrent host and debug operation is not feasible. Therefore, embedded SoCs and mobile devices currently need an additional debug mechanism through an UART port, or an Ethernet port, or an USB Device port when the USB 3.0 host function is enabled, thereby adding cost to a device. FIG. 5C illustrates this additional UART/Ethernet/USB Device port. The other current option is to have a two-port USB host. Unfortunately, all of these solutions add addition cost to the SoC. Moreover, many current applications (such as cell phones and other small devices) do not have space to add an additional UART or Ethernet or USB Device or USB3.0 Host receptacle.

Therefore, a need arises for a configuration that provides a device debug feature in a one-port xHCI host controller while minimizing silicon cost, avoiding an additional connector, and allowing concurrent host and debug operations.

SUMMARY OF THE DISCLOSURE

An improved USB host controller and method supports concurrent host and device debug operations with only one USB port. The USB host controller can include dedicated data paths for the host and debug device. In one embodiment, separate cache memory can be provided for the host and debug device. The debug test set up can include a split USB cable, which facilitates the concurrent host and device debug operations.

A split universal serial bus (USB) cable can include first, second, and third USB plugs, and first and second cables. The first USB plug can conform to the USB 3.0 Specification, and can be an A type connector. The second USB plug can conform to the USB 2.0 or the USB 3.0 Specification, and can be a B type connector. The third USB plug can conform to the USB 3.0 Specification, and can be the A type connector. The first cable can couple the first and second plugs and can include VBUS, D−, D+, and GND wires. The second cable can couple the first and third plugs and can include GND, StdA_SSRX−, StdA_SSRX+, GND_DRAIN, StdA_SSTX−, and StdA_SSTX+ wires.

In another split USB cable, the first USB plug can conform to USB 3.0 Specification, and can be an A type connector. The second USB plug can conform to the USB 3.0 Specification, and can be a B type connector. The third USB plug can conform to the USB 2.0 or the USB 3.0 Specification, and can be the A type connector. The first cable can couple the first and second plugs and include VBUS, GND, StdA_SSRX−, StdA_SSRX+, GND_DRAIN, StdA_SSTX−, and StdA_SSTX+ wires. The second cable can couple the first and third plugs and include GND, D−, and D+ wires.

A debug test set up can include a universal serial bus (USE) host controller conforming to the USB 3.0 Specification. The USB host controller can include an extensible host interface (xHCI). The debug test set up can further include a USB device and a USB debug host. The USB device can conform to the USB 2.0 or the USB 3.0 Specification. The USB debug host can conform to the USB 3.0 Specification. The debug test can further include three sets of USB connectors and two cables. First USB connectors can conform to the USB 3.0 Specification. The first USB connectors can include a first plug and a first receptacle, the first plug being an A type connector, and the first receptacle being an A type receptacle or an AB type receptacle. Second USB connectors can conform to the USB 2.0 or the USB 3.0 Specification. The second USB connectors can include a second plug and a second receptacle, the second plug being a B type plug, and the second receptacle being a B type receptacle or the AB type receptacle. Third USB connectors can conform to the USB 3.0 Specification. The third USB connectors can include a third plug and a third receptacle, the third plug being the A type plug, and the third receptacle being the A type receptacle or the AB type receptacle. The first cable can couple the first and second connectors and can include VBUS, D−, D+, and GND wires. The second cable can couple the first and third connectors and can include GND, StdA_SSRX−, StdA_SSRX+, GND_DRAIN, StdA_SSTX−, and StdA_SSTX+ wires. This debug test set up can provide concurrent USB 2.0 traffic between the USB 3.0 host controller and the USB device and SuperSpeed traffic between the USB 3.0 host controller and the USB debug host.

Another debug test set up can include a USB host controller conforming to the USB 3.0 Specification. The USB host controller can include an extensible host interface (xHCI). The debug test set up can further include a USB device and a USB debug host. The USB device can conform to the USB 3.0 Specification. The USB debug host can conform to the USB 2.0 or the USB 3.0 Specification. The debug test can further include three sets of USB connectors and two cables. First USB connectors can conform to the USB 3.0 Specification. The first USB connectors can include a first plug and a first receptacle, the first plug being an A type connector, and the first receptacle being an A type receptacle or an AB type receptacle. Second USB connectors can conform to the USB 3.0 Specification. The second USB connectors can include a second plug and a second receptacle, the second plug being a B type plug, and the second receptacle being a B type receptacle or the AB type receptacle. Third USB connectors can conform to the USB 2.0 or the USB 3.0 Specification. The third USB connectors can include a third plug and a third receptacle, the third plug being the A type plug, and the third receptacle being the A type receptacle or the AB type receptacle. The first cable can couple the first and second connectors and include VBUS, GND, StdA_SSRX−, StdA_SSRX+, GND_DRAIN, StdA_SSTX−, and StdA_SSTX+ wires. The second cable can couple the first and third connectors and include GND, D−, and D+ wires. This debug test set up can provide concurrent SuperSpeed traffic between the USB 3.0 host controller and the USB device, and USB 2.0 traffic between the USB 3.0 host controller and the USB debug host.

A universal serial bus (USB) host controller, which conforms to universal serial bus (USB) 3.0 Specification, includes an extensible host interface (xHCI). The USB host controller can further include a host, a first data path component coupled to the host, a debug device, and a second data path component coupled to the debug device. The host and debug device are configured to simultaneously operate during their respective host and device debug operations using a single port of the USB host controller. The USB host controller can further include a direct memory access (DMA) engine coupled to the first and second data path components and a system bus. In one embodiment, the host and the debug device can be configured to access different cache memory.

A method of performing a debug test can include performing concurrent host and device debug operations in a host controller conforming to a first universal serial bus (USB) Specification. The host controller includes an Extensible Host Interface (xHCI). The performing can include using a connector coupled to a split cable. The split cable includes a first cable conforming to the USB 2.0 Specification and a second cable conforming to the USB 3.0 Specification, SuperSpeed only.

A method of fabricating or designing a universal serial bus (USE) host controller includes providing a first datapath for a host, providing a second datapath for a debug device, and coupling the first and second data paths to a direct memory access (DMA) engine. The DMA engine provides outputs to one port of the USB host controller. In one embodiment, separate cache memory can be provided for the host and the debug device.

A method of fabricating or designing a universal serial bus (USB) split cable can include providing: a first connector (type A, conforming to a first USB Specification), a second connector (type B, conforming to a second USB Specification), a third connector (type A, conforming to the first USB Specification), a first cable (conforming to the second USB Specification), and a second cable (conforming to the first USB Specification and only providing SuperSpeed transfer). The first and second connectors can be coupled using the first cable. The first and third connectors can be coupled using the second cable.

Another method of fabricating or designing a universal serial bus (USE) split cable can include providing: a first connector (type A, conforming to a first USB Specification), a second connector (type B, conforming to the first USB Specification), a third connector (type A, conforming to a second USB Specification), a first cable (conforming to the first USB Specification and only providing SuperSpeed transfer), and a second cable (conforming to the second USB Specification). The first and second connectors can be coupled using the first cable. The first and third connectors can be coupled using the second cable.

The above-described USB cables, debug test set ups, and methods are applicable to any set of USB Specifications. Thus, although the USB 2.0 Specification and the USB 3.0 Specification are used above, other USB specifications, both current and future, can also be used (e.g. the USB 3.0 Specification and a further USB 4.0 Specification, or a future USB 4.0 Specification and a future USB 5.0 Specification).

BRIEF DESCRIPTION OF THE DRAWINGS

FIG. 8 illustrates exemplary combinations of connectors (CONs), cables, USB devices, and debug hosts (including those shown in FIGS. 6 and 7.

DETAILED DESCRIPTION OF THE DRAWINGS

An improved USB host controller and method supports concurrent host and device debug operations with only one usable USB port. The described embodiments save silicon cost and avoid additional connectors, which are undesirable in ever-smaller devices.

Figures 1A, 1B:
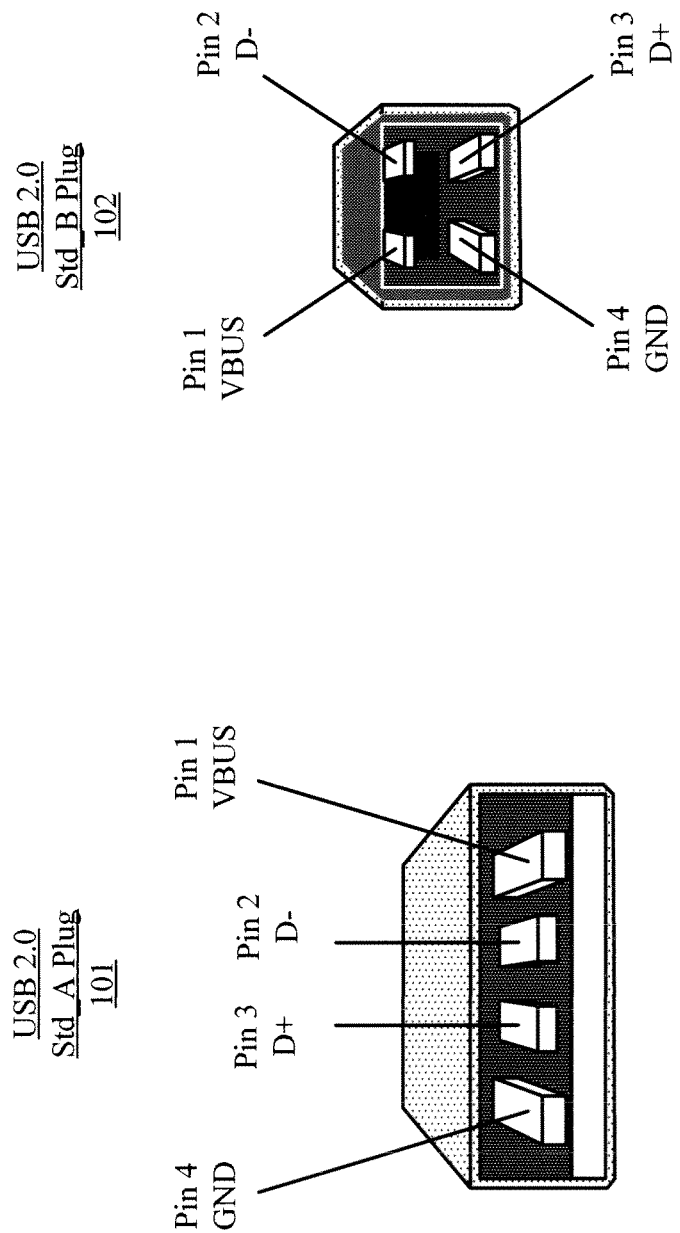
FIGS. 1A and 1B illustrate USB 2.0 standard-A and standard-B plugs, respectively.
Figure 2B:
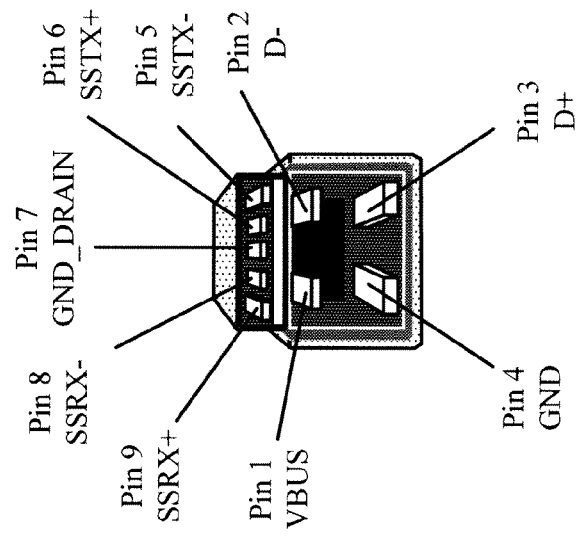
FIGS. 2A and 2B illustrate USB 3.0 standard-A and standard-B plugs, respectively.
Figure 2A:
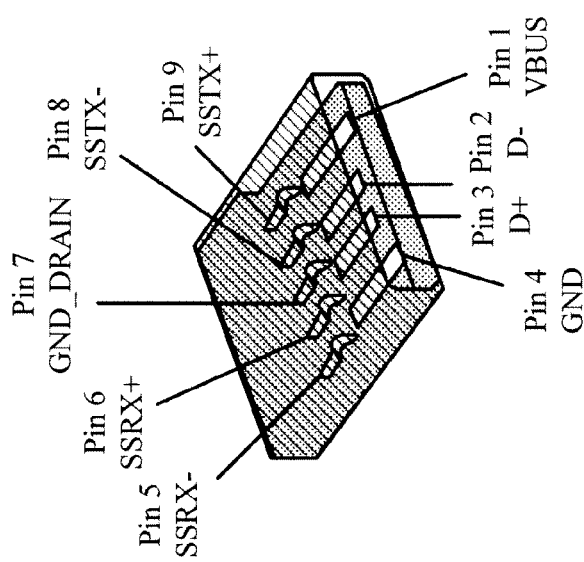
Figure 4:
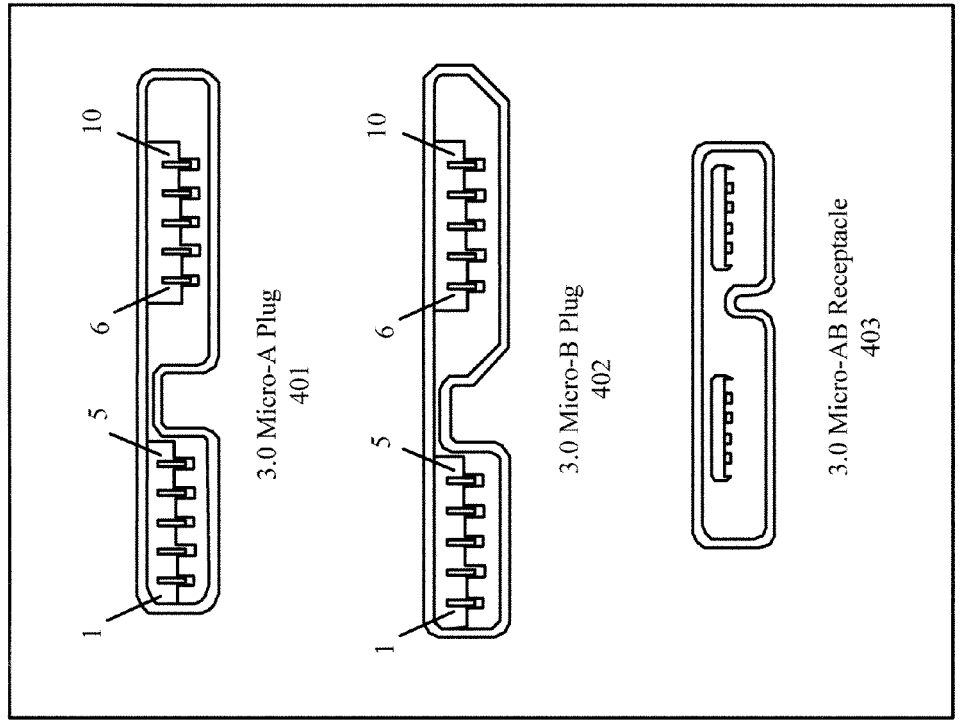
FIG. 4 illustrates USB 3.0 micro-A and micro-B plugs, as well as a USB 3.0 micro-AB receptacle.
Figure 3:
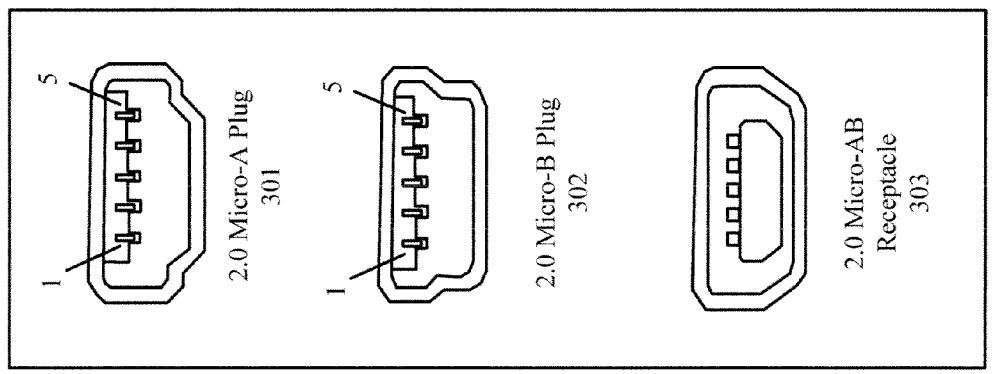
FIG. 3 illustrates USB 2.0 micro-A and micro-B plugs, as well as a USB 2.0 micro-AB receptacle.
Figure 5A:
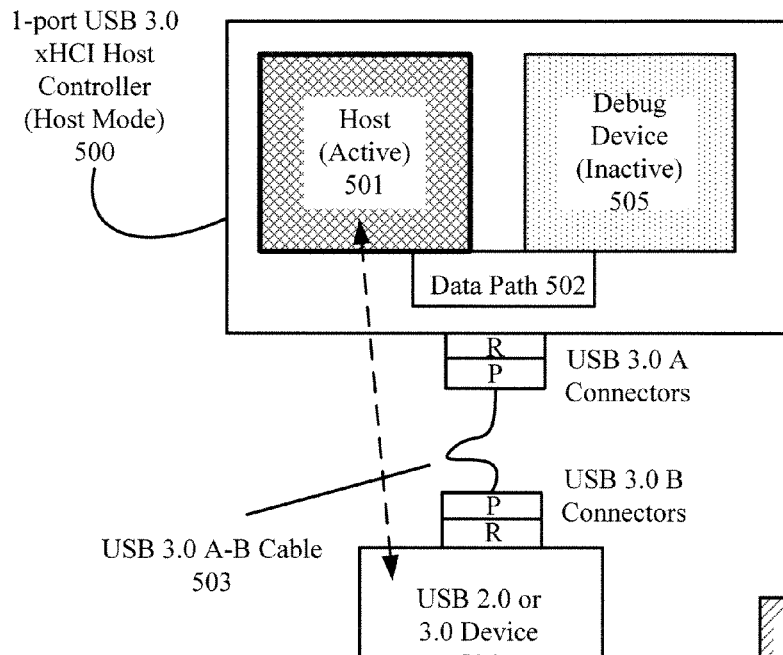
FIG. 5A illustrates an exemplary one-port USB Extensible Host Interface (xHCI) Host controller configuration for host operation.
Figure 5C:
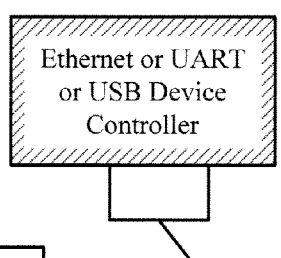
FIG. 5C illustrates an exemplary host controller configuration that includes an Ethernet/USB, a UART/USB, or a USB solution to allow for simultaneous host and debug operations.
Figure 5B:
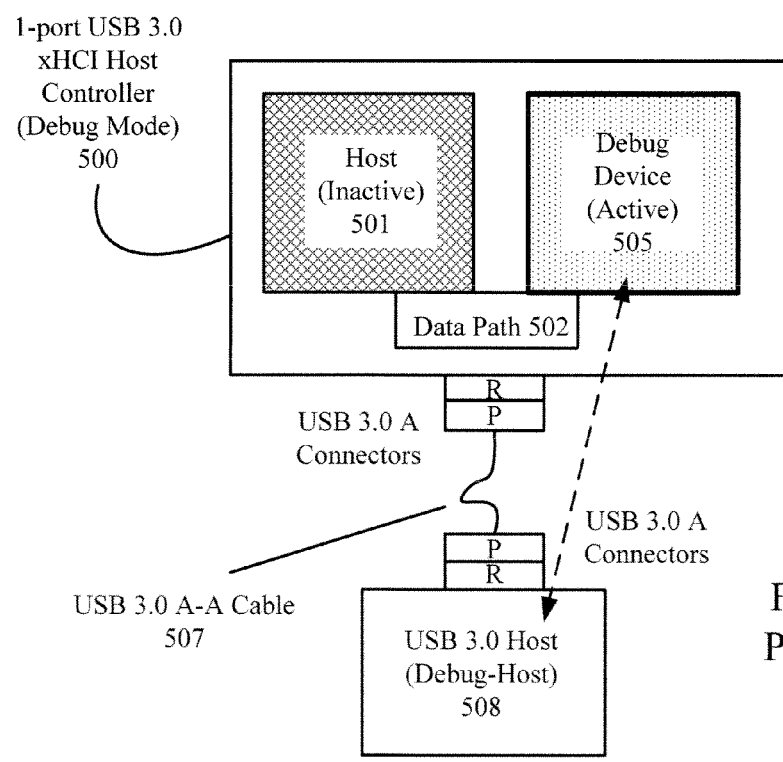
FIG. 5B illustrates an exemplary one-port USB Extensible Host Interface (xHCI) Host controller configuration for debug operation.
Figure 6:
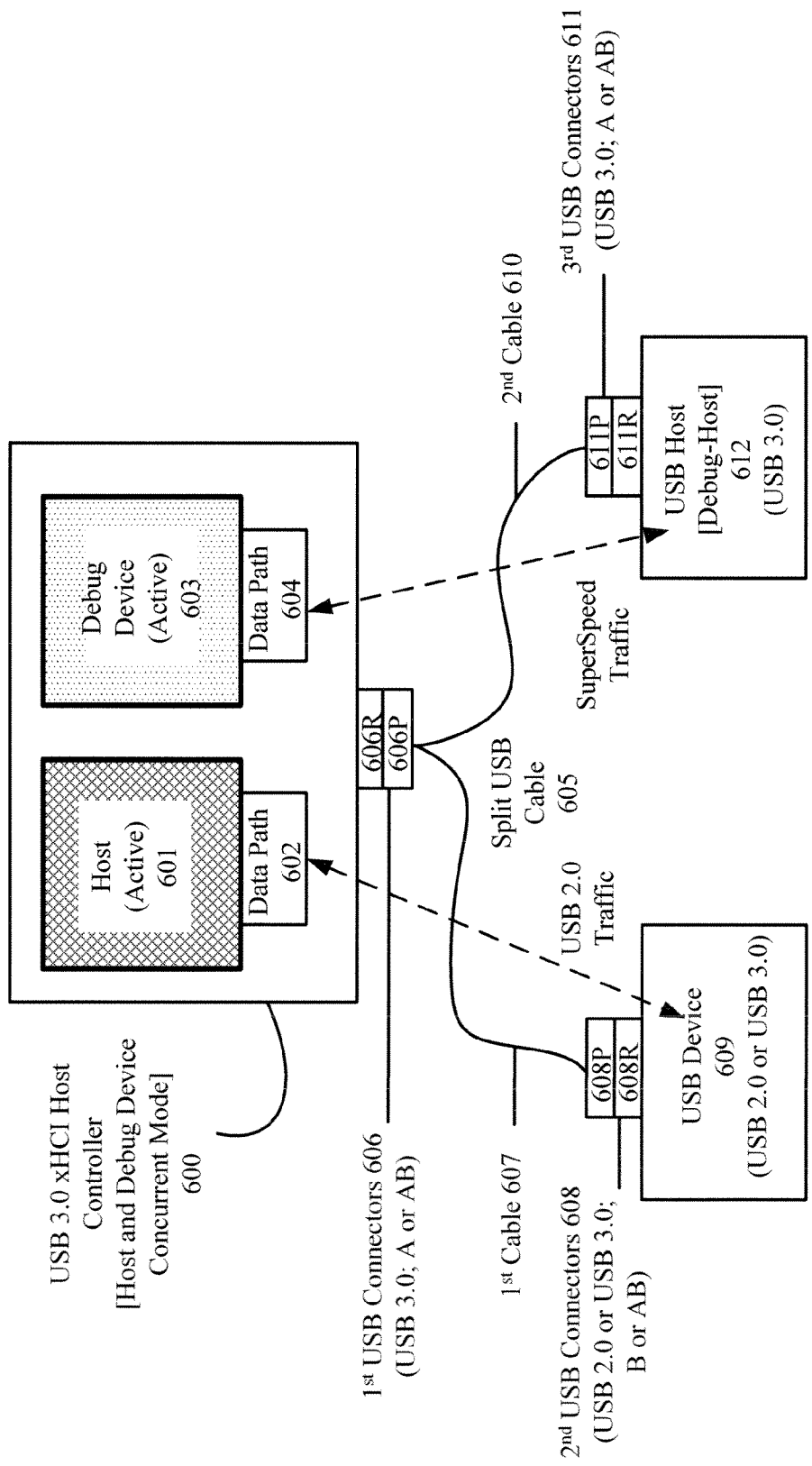
FIG. 6 illustrates an exemplary USB Extensible Host Interface (xHCI) Host controller configuration for concurrent host and debug device operation. This debug test set up can provide concurrent USB 2.0 traffic between the USB 3.0 host controller and the USB device and SuperSpeed traffic between the USB 3.0 host controller and the USB debug host.

FIG. 6 illustrates an exemplary debug test setup including a USB 3.0 xHCI host controller 600. Host controller 600 includes a host 601 as well as a debug device 603. In accordance with one feature of an improved host controller and described in detail herein, host and debug operations can be performed simultaneously. To facilitate these concurrent operations, host 601 has a corresponding data path 602 for buffering and flow control, and debug device 603 has its own corresponding data path 604 for buffering and flow control independent of data path 602.

Notably, host controller 600 need only use a single port for simultaneous host and debug operations. To facilitate simultaneous host and debug operations, a split USB cable 605 can also be provided. In one embodiment, split USB cable 605 can include three plugs and two cables. First USB connectors 606 can conform to the USB 3.0 Specification, and can include an A plug, and an A or AB receptacle. Note that both receptacles (R) and plugs (P) are labeled in the figures hereinafter where the generic term "connectors" is used. For example, first USB connectors 606 include a first plug 606P and a first receptacle 606R. Second USB connectors 608 can conform to the USB 2.0 Specification or the USB 3.0 Specification, and can include a B plug (second plug 608P), and a B or AB receptacle (second receptacle 608R). Third USB connectors 611 can conform to the USB 3.0 Specification, and can include an A plug (third plug 611P), and an A or an AB receptacle (third receptacle 611R). A first cable 607 can couple first plug 606P and second plug 608P, and can include wires for providing VBUS, D−, D+, and GND signals. A second cable 610 can couple first plug 606P and third plug 611P, and can include wires for providing GND, StdA_SSRX−, StdA_SSRX+, GND_DRAIN, StdA_SSTX−, and StdA_SSTX+ signals.

The debug test set up shown in FIG. 6 can advantageously provide concurrent USB 2.0 traffic between USB 3.0 host controller 600 and USB device 609 and SuperSpeed traffic between USB 3.0 host controller 600 and USB debug host 612. Notably, the xHCI host can advantageously provide these concurrent host and device debug functions even when the xHCI host controller has only one USB 3.0 port.

Figure 7:
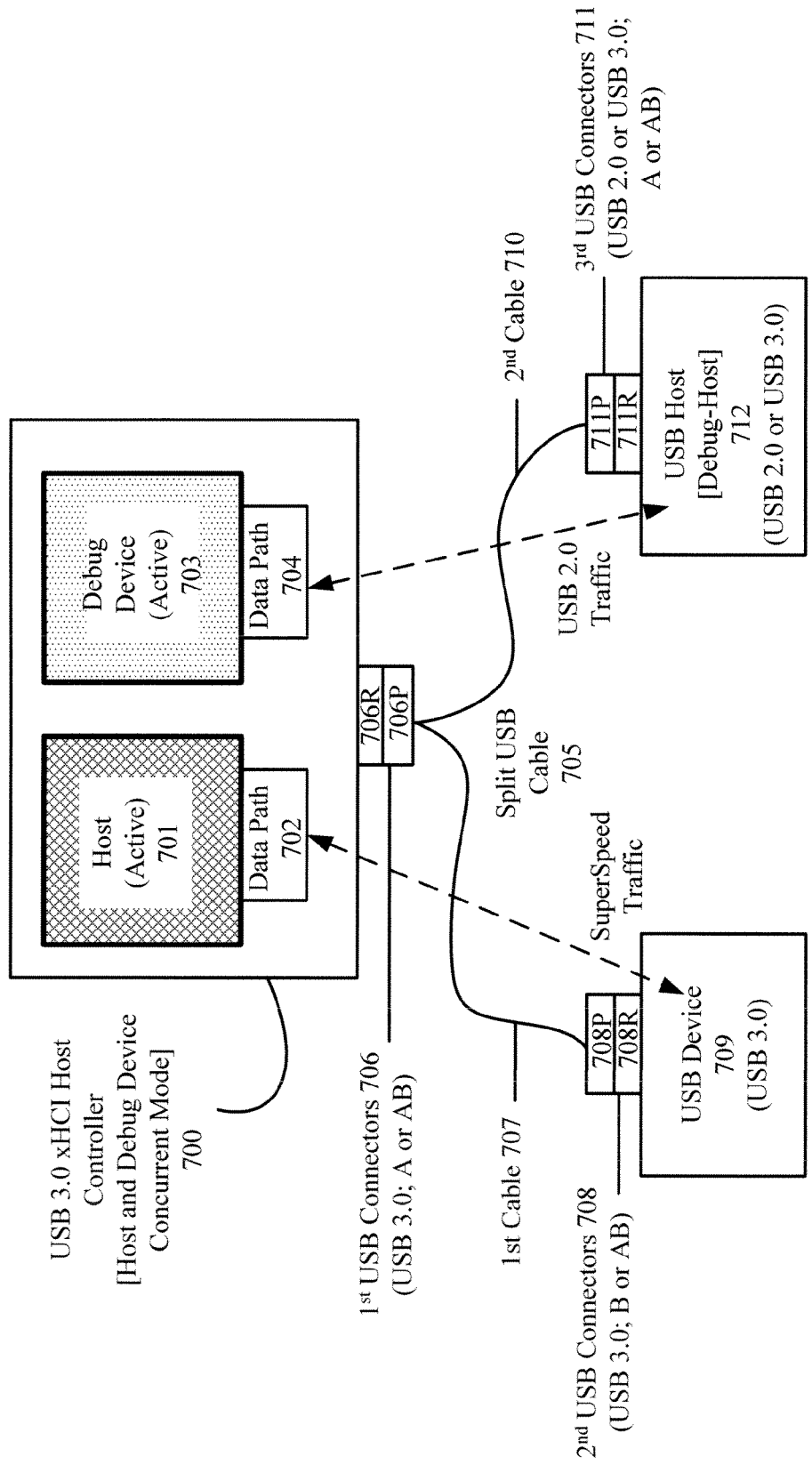
FIG. 7 illustrates another exemplary USB Extensible Host Interface (xHCI) Host controller configuration for concurrent host and debug device operation. This debug test set up can provide concurrent SuperSpeed traffic between the USB host controller and the USB device, and USB 2.0 traffic between the USB host and the USB debug host.

FIG. 7 illustrates another exemplary debug test setup including a USB 3.0 xHCI host controller 700. Host controller 700 includes a host 701 as well as a debug device 703. To facilitate concurrent host and debug operations, host 701 has a corresponding data path 702 for buffering and flow control, and debug device 703 has its own corresponding data path 704 for buffering and flow control independent of data path 702.

To facilitate simultaneous host and debug operations, a split USB cable 705 can also be provided. In one embodiment, split USB cable 705 can include three plugs and two cables. First USB connectors 706 can conform to the USB 3.0 Specification, and can include an A plug (first plug 706P), and an A or an AB receptacle (first receptacle 706R). Second USB connectors 708 can conform to the USB 3.0 Specification, and can include a B plug (second plug 708P), and a B or an AB connector (second receptacle 708R). Third USB connectors 711 can conform to the USE 2.0 or USE 3.0 Specification, and can include an A plug (third plug 711P), and an A or an AB receptacle (third receptacle 711R). A first cable 707 can couple first plug 706P and second plug 708P, and can include wires for providing GND, StdA_SSRX−, StdA_SSRX+, GND_DRAIN, StdA_SSTX−, StdA_SSTX+, and VBUS signals. A second cable 710 can couple first plug 706P and third plug 711P, and can include wires for providing D−, D+, and GND signals. The debug test set up shown in FIG. 7 can provide concurrent SuperSpeed traffic between USB 3.0 host controller 700 and USB device 709, and USB 2.0 traffic between USB 3.0 host controller 700 and USB debug host 712.

FIG. 8 illustrates exemplary combinations of connectors (CONs), cables, USB devices, and debug hosts (including those shown in FIGS. 6 and 7. Note that the cable designations of USB 2.0 and 3.0 indicate wire packages that can be used, but other embodiments may include individual wires for the specific signals without use of a USB 2.0 or 3.0 cable. For example, in embodiment 3, cable 2 is indicated as USB 2.0, but only needs wires to provide D−, D+, and GND. Therefore, this cable 2 can include fewer wires than that provided in a USB 2.0 cable. In one embodiment, where USE-conforming cables are used, only those wires needed are connected to the corresponding plug pins.

Figure 9:
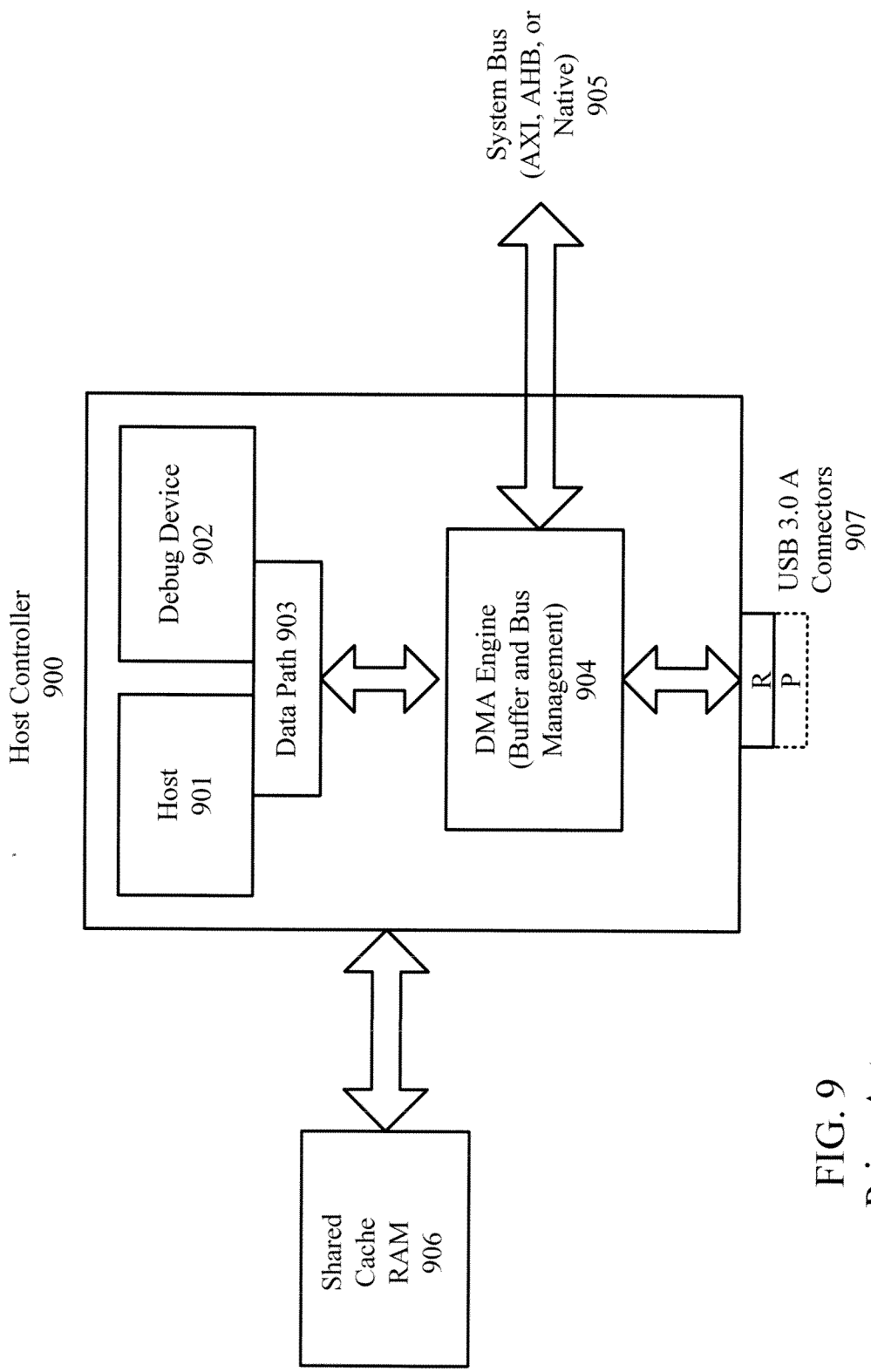
FIG. 9 illustrates an exemplary block diagram of a host system in which either the host or the debug device are active at a given time.

In one embodiment, the host controller can interface with a modified cache to further enhance test performance. FIG. 9 illustrates a block diagram of a standard host controller 900 including a host 901 and debug device 902 (USB 3.0 A connectors 907 are shown for context). Note that host 901 and debug device 902 share a data path 903, which in turn is coupled to a direct memory access (DMA) engine 904. Thus, data path 903 provides an exemplary single data path from both host 901 and debug device 902. DMA engine 904 can provide both buffering and bus management for a system bus 905 and connection to USB connectors 907. System bus 905 can be a bus conforming to a specific operating system, for example, Advanced eXtensible Interface (AXI®)(a proprietary SoC bus interface developed by ARM), an advanced high performance (AHB), or a native bus. Notably, in a standard embodiment, host 901 and debug device 902 can share a cache RAM 906.

Figure 10:
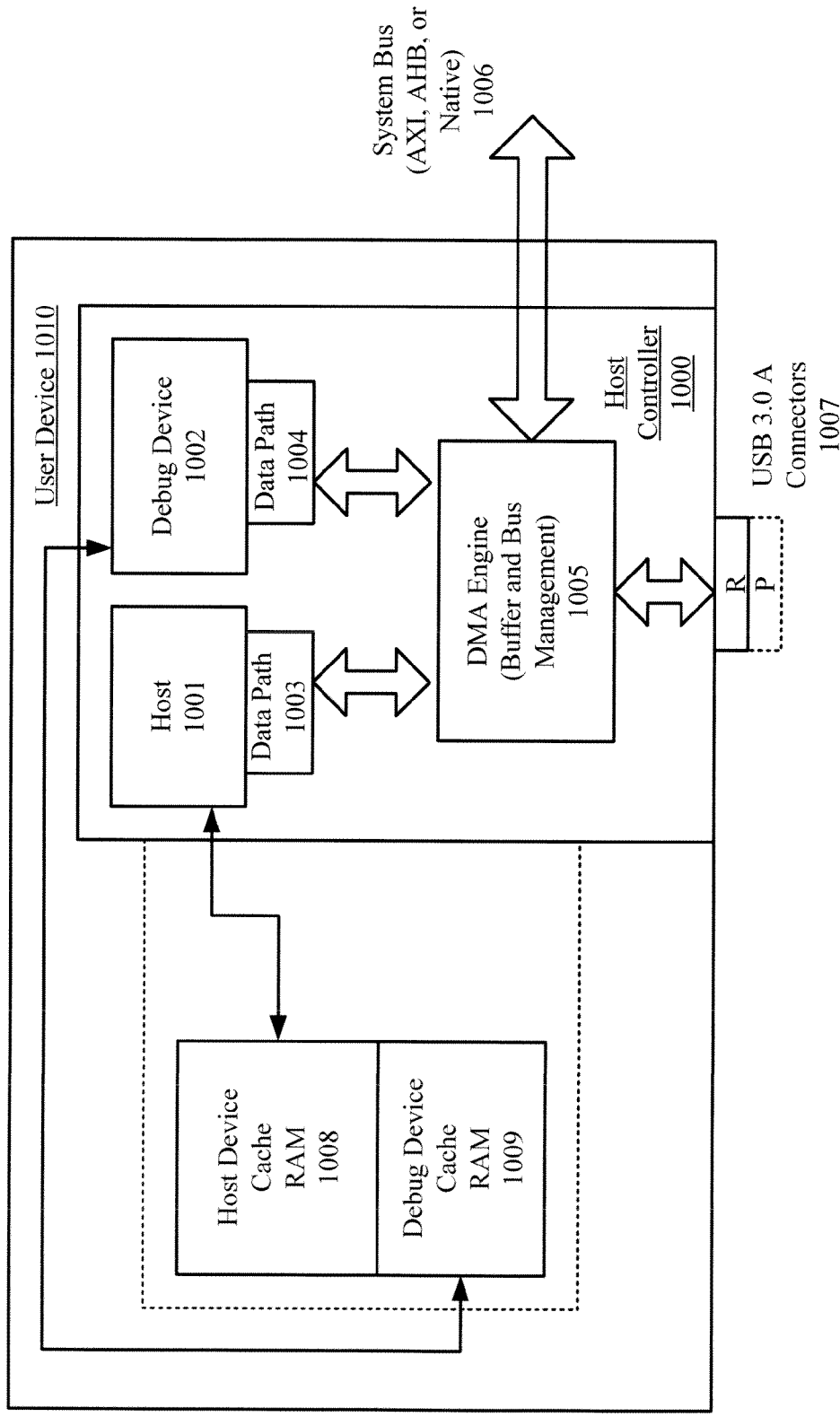
FIG. 10 illustrates an exemplary block diagram of a host system in which the host and the debug device can be simultaneously active.

FIG. 10 illustrates a block diagram of a standard host controller 1000 including a host 1001 and a debug device 1002 (USB 3.0 A connectors 1007 are shown for context). In accordance with an embodiment that provides enhanced test performance (and described briefly in reference to FIGS. 6 and 7), host 1001 and debug device 1002 each have separate associated data paths, thereby providing for two independent data paths. Specifically, host 1001 is coupled to a data path 1003, and debug device 1002 is coupled to a data path 1004. data paths 1003 and 1004 in turn can be coupled to a direct memory access (DMA) engine 1005. DMA engine 1005 can provide both buffering and bus management for a system bus 1006.

Notably, in this improved performance embodiment, host 1001 and debug device 1002 can also have separate cache RAM (or other memory). In this embodiment, host 1001 can have a host device cache RAM 1008, and debug device 1002 can have a debug device cache RAM 1009. In one embodiment, host device cache RAM 1008 is larger than debug device cache RAM 1009, but such sizing is, in general, implementation specific. In one high performance embodiment, host controller 1000 can include cache RAM 1008 and 1009, as shown by the dotted lines.

Note that the system bandwidth is typically large enough to provide for simultaneous host and device debug operations. Specifically, because of the large system bandwidth, DMA engine 1005 can essentially provide the 2.0 and SuperSpeed traffic to USB 3.0 A connectors 1007 concurrently with minimal additional logic. Notably, the protocol for operating host 1001 and debug device 1002 in parallel is the same as operating those devices separately. In one embodiment, host controller 1000 can be included in a user device 1010, such as a personal computer, a cell phone, a tablet, or some other device.

Figure 11:
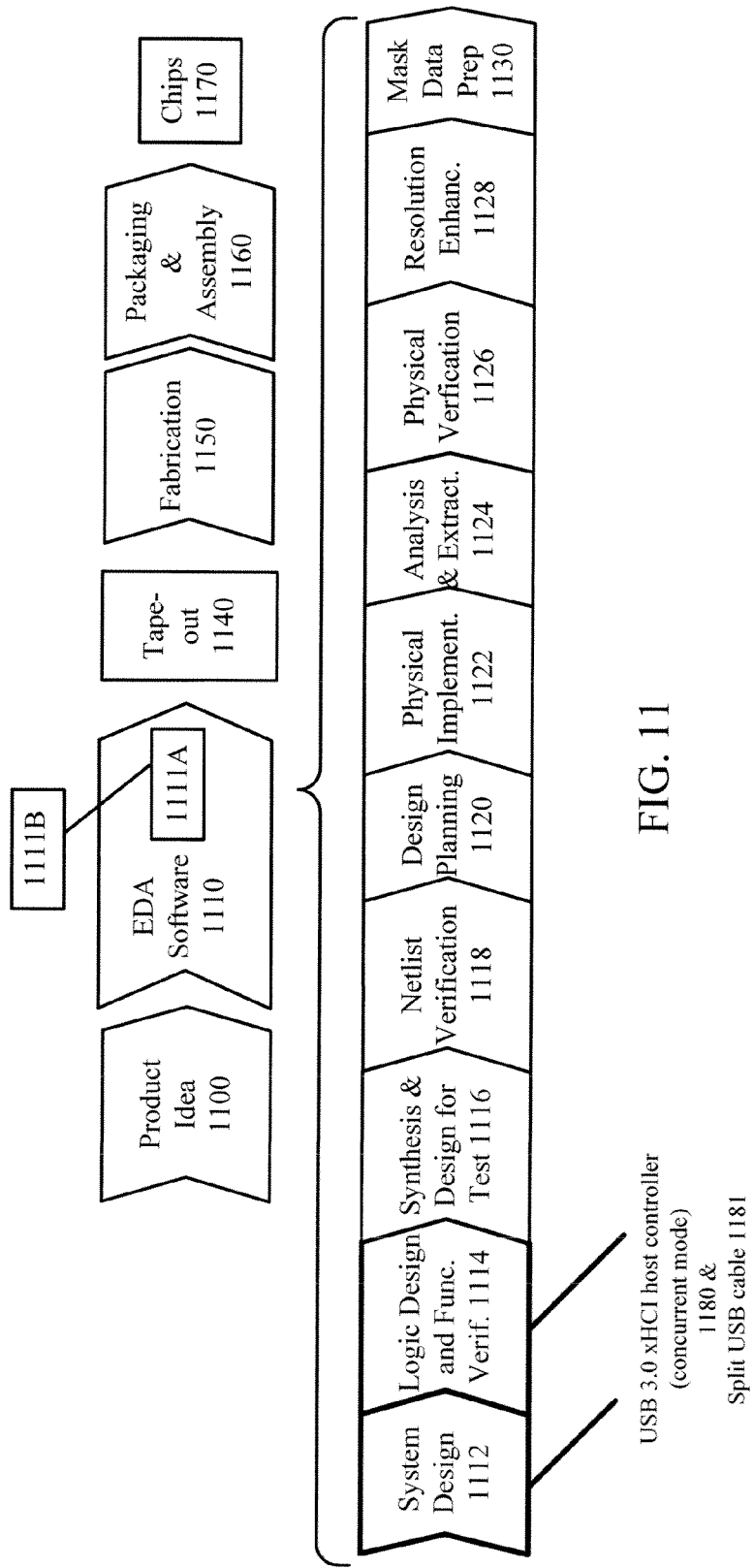
FIG. 11 shows a simplified representation of an exemplary digital ASIC design flow.

FIG. 11 shows a simplified representation of an exemplary digital ASIC design flow that can use the above-described improved host controller and split USB cable. At a high level, the process starts with the product idea (step 1100) and is realized in an EDA software design process (step 1110). When the design is finalized, it can be taped-out (event 1140). After tape out, the fabrication process (step 1150) and packaging and assembly processes (step 1160) occur resulting, ultimately, in finished chips (result 1170).

The EDA software design process (step 1110) is actually composed of a number of steps 1112-1130, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components/steps of the EDA software design process (step 1110) will now be provided. In one embodiment, one or more steps of the EDA software design process can be implemented using a computer-readable medium 1111A, which is read by a computer 1111B. Note that Astro, AstroRail, CustomSim, ESP, Hercules, IC Compiler, Magellan, Model Architect, Power Compiler, PrimeRail, Proteus, ProteusAF, PSMGen, Saber, StarRC, and System Studio are trademarks of Synopsys, Inc., and CATS, DesignWare, Design Compiler, Formality, HSIM, Leda, NanoSim, Primetime, Syndicated, TetraMAX, VCS, and Vera are registered trademarks of Synopsys, Inc.

System design (step 1112): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber™, System Studio™, and DesignWare® products. In one embodiment, a USB 3.0 xHCI host controller 1180 and a split USB cable 1181 (implemented as described in any of the embodiments above) can be used during step 1112.

Logic design and functional verification (step 1114): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include HSIM®, NanoSim®, CustomSim™, VCS®, VERA®, DesignWare®, Magellan™, Formality®, ESP™ and LEDA® products. In one embodiment, USB 3.0 xHCI host controller 1180 and split USB cable 1181 can be used during step 1114.

Synthesis and design for test (step 1116): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler™, Tetramax®, and DesignWare® products.

Netlist verification (step 1118): At this step, the netlist is checked for compliance with timing constraints and for correspondence with the VHDL/Verilog source code. Exemplary EDA software products from Synopsys, Inc. that can be used at this step include Formality®, PrimeTime™, and VCS® products.

Design planning (step 1120): Here, an overall floorplan for the chip is constructed and analyzed for timing and top-level routing. Exemplary EDA software products from Synopsys, Inc. that can be used at this step include Astro™ and IC Compiler™ products.

Physical implementation (step 1122): The placement (positioning of circuit elements) and routing (connection of the same) occurs at this step. Exemplary EDA software products from Synopsys, Inc. that can be used at this step include the Astro™ and IC Compiler™ products.

Analysis and extraction (step 1124): At this step, the circuit function is verified at a transistor level, this in turn permits what-if refinement. Exemplary EDA software products from Synopsys, Inc. that can be used at this step include Astro-Rail™, PrimeRail™, Primetime, and Star RC/XT™ products.

Physical verification (step 1126): At this step various checking functions are performed to ensure correctness for: manufacturing, electrical issues, lithographic issues, and circuitry. Exemplary EDA software products from Synopsys, Inc. that can be used at this step include the Hercules™ product.

Resolution enhancement (step 1128): This step involves geometric manipulations of the layout to improve manufacturability of the design. Exemplary EDA software products from Synopsys, Inc. that can be used at this step include Proteus™, ProteusAF™, and PSMGen™ products.

Mask data preparation (step 1130): This step provides the "tape-out" data for production of masks for lithographic use to produce finished chips. Exemplary EDA software products from Synopsys, Inc. that can be used at this step include the CATS® family of products.

As discussed above, the host and debug device of a host controller can be active at the same time. The host controller can advantageously provide separate data paths for each of the host and debug devices as well as separate memory. A DMA engine of the host controller can handle traffic from both the host and debug devices. Because of system bandwidth, the DMA engine is able to output signals from the host and debug device concurrently to one port of the host controller. Note that in some embodiments, the host controller may, in fact, have additional ports, but only one USB port can be in debug mode at any given time.

Figure 12:
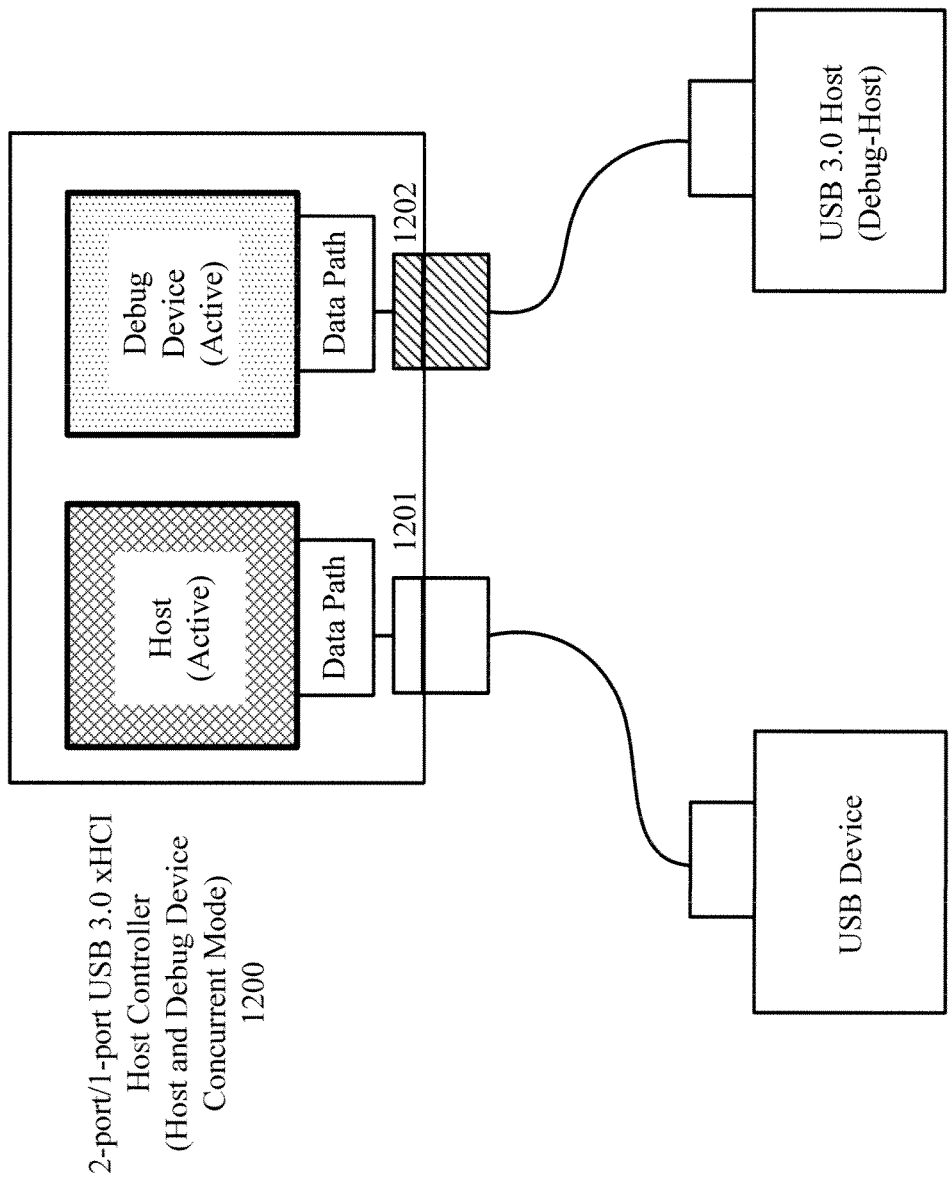
FIG. 12 illustrates a two-port factory only host controller configuration that becomes a one-port host controller as a user device.

In some embodiments, even though more than one USB port is provided on the device during manufacturing, after shipping only one USB port may be accessible. For example, FIG. 12 illustrates an exemplary 2-port/1-port USB 3.0 xHCI host controller 1200 that in a test mode factory only set-up has two ports 1201 and 1202 available. In this configuration, the host and debug device can be respectively coupled to ports 1201 and 1202. However, after final assembly, host controller 1200 only has port 1201 available. Therefore, the split cable described above can then be used to perform concurrent host and debug operations.

Indeed, even though 1-port host controllers are described above, any host controller having limited ports can benefit from the above-described embodiments.

Although illustrative embodiments of the invention have been described in detail herein with reference to the accompanying figures, it is to be understood that the invention is not limited to those precise embodiments. For example, the above-described USB cables, debug test set ups, and methods are applicable to any set of USB Specifications. Thus, although the USB 2.0 Specification and the USB 3.0 Specification are used above, other USB specifications, both current and future, can also be used (e.g. the USB 3.0 Specification and a further USB 4.0 Specification, or a future USB 4.0 Specification and a future USB 5.0 Specification). Thus, the scope of the invention is defined by the following Claims and their equivalents.

The invention claimed is:

1. A universal serial bus (USB) host controller conforming to a first universal serial bus (USB) Specification, the USB host controller including an extensible host interface (xHCI), the USB host controller further comprising:
a host;
a first data path component coupled to the host;
a debug device; and
a second data path component coupled to the debug device, wherein the host and debug device are configured to simultaneously operate during their respective host and device debug operations using a single port of the USB host controller.

2. The USB host controller of claim 1, further including a direct memory access (DMA) engine coupled to the first and second data path components and a system bus.

3. The USB host controller of claim 1, wherein the host and the debug device are configured to access different memory.

4. The USB host controller of claim 1, wherein the first USB Specification comprises the USB 3.0 Specification.

5. The USB host controller of claim 1, wherein the first data path component is configured to perform buffering and flow control for the host, and the second data path component is configured to perform buffering and flow control for the debug device, independent of the first data path component.

6. The USB host controller of claim 1, wherein the first data path component couples the host to the single port of the USB host controller, and the second data path component independently couples the debug device to the single port of the USB host controller.

7. The USB host controller of claim 1, wherein the single port of the USB host controller comprises a USB 3.0 port.

8. The USB host controller of claim 1, wherein the host uses the single port to communicate using USB 2.0 traffic and the debug device concurrently uses the single port to communicate using USB 3.0 traffic.

9. The USB host controller of claim 1, wherein the host uses the single port for communication of VBUS, D−, D+, and GND signals, and wherein the debug device concurrently uses the single port for communication of GND, StdA_SSRX−, StdA_SSRX+, GND_DRAIN, StdA_SSTX−, and StdA_SSTX+ signals.

10. The USB host controller of claim 1, wherein the host uses the single port to communicate using USB 3.0 traffic and the debug device concurrently uses the single port to communicate using USB 2.0 traffic.

11. The USB host controller of claim 1, wherein the debug device uses the single port for communication of VBUS, D−, D+, and GND signals, and wherein the host concurrently uses the single port for communication of GND, StdA_SSRX−, StdA_SSRX+, GND_DRAIN, StdA_SSTX− and StdA_SSTX+ signals.

12. The USB host controller of claim 1, further comprising a direct memory access (DMA) engine coupling the first and second data path components to the single port of the USB host controller.

13. The USB host controller of claim 12, wherein the DMA engine is further coupled to a system bus.

14. A method of operating a universal serial bus (USB) host controller conforming to a first universal serial bus (USB) Specification, the USB host controller including an extensible host interface (xHCI), the method comprising:
 operating a host of the USB host controller; and
 operating a debug device of the USB host controller, wherein the host and the debug device operate concurrently using a single port of the USB host controller.

15. The method of claim 14, further comprising:
 performing buffering and flow control between the host and the single port of the USB host controller using a first data path component; and
 performing buffering and flow control between the debug device and the single port of the USB host controller using a second data path component, independent of the first data path component.

16. The method of claim 14, wherein the first USB Specification comprises the USB 3.0 Specification.

17. The method of claim 14, further comprising implementing the single port of the USB host controller using a USB 3.0 port.

18. The method of claim 14, wherein the host uses the single port to communicate using USB 2.0 traffic and the debug device concurrently uses the single port to communicate using USB 3.0 traffic.

19. The method of claim 14, wherein the host uses the single port for communication of VBUS, D−, D+, and GND signals, and wherein the debug device concurrently uses the single port for communication of GND, StdA_SSRX−, StdA_SSRX+, GND_DRAIN, StdA_SSTX−, and StdA_SSTX+ signals.

20. The method of claim 14, wherein the host uses the single port to communicate using USB 3.0 traffic and the debug device concurrently uses the single port to communicate using USB 2.0 traffic.

21. The method of claim 14, wherein the debug device uses the single port for communication of VBUS, D−, D+, and GND signals, and wherein the host concurrently uses the single port for communication of GND, StdA_SSRX−, StdA_SSRX+, GND_DRAIN, StdA_SSTX− and StdA_SSTX+ signals.

22. The method of claim 14, further comprising using a direct memory access (DMA) engine to couple the first and second data path components to the single port of the USB host controller.

23. The method of claim 22, further comprising coupling the DMA engine to a system bus.

24. The method of claim 14, further comprising:
 accessing a first cache memory using the host; and
 accessing a second cache memory, separate from the first cache memory, using the debug device.

* * * * *